(12) United States Patent
Hirata et al.

(10) Patent No.: US 6,851,963 B2
(45) Date of Patent: Feb. 8, 2005

(54) PIN GRID ARRAY SOCKET WITH REINFORCEMENT PLATE

(75) Inventors: Toshihisa Hirata, Yamato (JP); Masami Sasao, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/467,500

(22) PCT Filed: Feb. 22, 2002

(86) PCT No.: PCT/US02/05459

§ 371 (c)(1),
(2), (4) Date: Aug. 5, 2003

(87) PCT Pub. No.: WO02/069684

PCT Pub. Date: Sep. 6, 2002

(65) Prior Publication Data

US 2004/0067674 A1 Apr. 8, 2004

(30) Foreign Application Priority Data

Feb. 22, 2001 (JP) .................................. 2001-046576

(51) Int. Cl.[7] .......................................... H01R 13/625
(52) U.S. Cl. ................................................... 439/342
(58) Field of Search ........................... 439/342, 259, 439/263, 264, 268

(56) References Cited

U.S. PATENT DOCUMENTS

| | | | | |
|---|---|---|---|---|
| 5,443,591 A | * | 8/1995 | Tsai | 439/342 |
| 6,109,947 A | * | 8/2000 | Lin | 439/342 |
| 6,146,178 A | * | 11/2000 | Walkup et al. | 439/342 |
| 6,171,128 B1 | * | 1/2001 | Huang et al. | 439/342 |
| 6,210,197 B1 | * | 4/2001 | Yu | 439/342 |
| 6,280,224 B1 | * | 8/2001 | Huang | 439/342 |
| 6,296,506 B1 | * | 10/2001 | Mizumura et al. | 439/342 |

* cited by examiner

*Primary Examiner*—Neil Abrams
(74) *Attorney, Agent, or Firm*—Robert J. Zeitler (57) ABSTRACT

A socket for a PGA package can maintain high reliability of connecting condition for a long period. The socket is constructed by mounting a reinforcement plate formed with a metal plate or the like at the position where the cam member contacts the slide plate so that the slide plate, which is formed of an insulative materials such as plastic or the like, will not be deformed upon exertion of a reaction force from a plurality of lead pins of a PGA package.

20 Claims, 7 Drawing Sheets

PIN GRID ARRAY SOCKET WITH REINFORCEMENT PLATE

FIELD OF THE INVENTION

The present invention relates to a socket for pin grid array ("PGA") package for connecting a PGA package, and in particular to a PGA socket with a wear resistance plate used to extend the life of the PGA socket.

BACKGROUND OF THE INVENTION

Conventional PGA sockets comprise a base housing having a plurality of terminals arranged in the form of grid, and a slide plate having a corresponding plurality of through holes arranged in the same form of grid as the base housing. The slide plate is placed on the base housing, and the slide plate moves between an open position, in which the lead pins of the PGA package can be inserted in the through holes to reach the terminal mounts with an insertion force of zero or close to zero, and a locking position, in which the inserted lead pins are put in engagement with the terminals.

A cam member is provided along the rear edge of the base housing, which when activated, moves the slide plate between the open and locked position. In one embodiment, the cam member comprises a cam shaft that is rotated by means of an operation handle provided along the side portion of the socket (for example, see Japanese Unexamined Patent Publication No. Heisei 7-142134). Alternatively, the cam member is provided in a direction extending through the base housing and the slide plate. By rotating the cam member by means of a driver or the like, the handle is eliminated.

In the construction where the cam member is provided in an orientation extending through the base housing and the slide plate, the cam member is biased against the slide plate as the slide plate moves from an open to a locked position. In the condition where the lead pins and the terminals are placed for engagement with each other (the locked position), a reaction force by a resilient force of the lead pin acts on the cam member. The reaction force acting between the metallic cam member and the insulative slide plate, such as plastic or the like, contacting the cam member becomes greater as the number of lead pins increase. By this force, the portion of the slide plate which is in contact with the cam member can become deformed due to the fact that the insulative slide plate is more flexible that the cam member. This deformation can result in a convex deformation in the slide plate that can cause a degradation in the reliability of the PGA socket. This deformation can be amplified in those situations where the PGA packages are exchanged numerous times due to the large number of times that the PGA socket must be actuated between its open and locked positions.

SUMMARY OF THE INVENTION

The present invention has been worked out in view of the shortcoming set forth above. It is therefore an object of the present invention to provide a socket for a PGA package which can maintain high reliability of connecting condition for a long period.

The present invention is constructed by mounting a reinforcement plate formed with a metal plate or the like at the location where the cam member contacts the slide plate so that the slide plate will not be deformed upon exertion of a reaction force from the plurality of lead pins of a pin grid array package. Rather that the reaction force being directed to the insulative slide plate, the reaction force is received by the reinforcement plate. This prevents the concaving deformation on the slide plate. Thus, a highly reliable connection between the lead pins of the PGA package and the terminals of the base housing can be achieved. Furthermore, the life of the socket is extended.

The slide plate may be formed of an insulative synthetic resin, the reinforcement plate mounted on the straight edge may be formed with a metal plate, and the cam member may be formed of a metal. The reinforcement plate may be formed in a cross-sectionally channel shaped configuration and may be mounted by clamping the reinforcement plate to a portion of the straight edge of the slide plate. The reinforcement plate may be formed into a cross-sectionally channel-shaped configuration having an upper wall and a lower wall clamping the slide plate. The lower wall of the reinforcement plate may have a length shorter than the upper plate.

In the preferred construction, a length of the reinforcement plate in a direction along the straight edge may be shorter than a length of the straight edge for slidably mounting the reinforcement plate along the straight edge. Also, a length of the reinforcement plate may be set at a length to permit engagement with the contact surface of the cam member even when the reinforcement plate is stopped with abutting the end of the reinforcement plate with the end of the straight edge.

In another embodiment, the reinforcement plate is mounted to the slide plate in such a manner that the reinforcement plate is moveable along the straight edge of the slide plate.

BRIEF DESCRIPTION OF THE ACCOMPANYING DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DESCRIPTION OF THE PREFERRED EMBODIMENTS

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein. It will be obvious, however, to those skilled in the art that the present invention may be practiced without these specific details. In other instance, well-known structure are not shown in detail in order to avoid unnecessary obscurity of the present invention.

Figure 1:
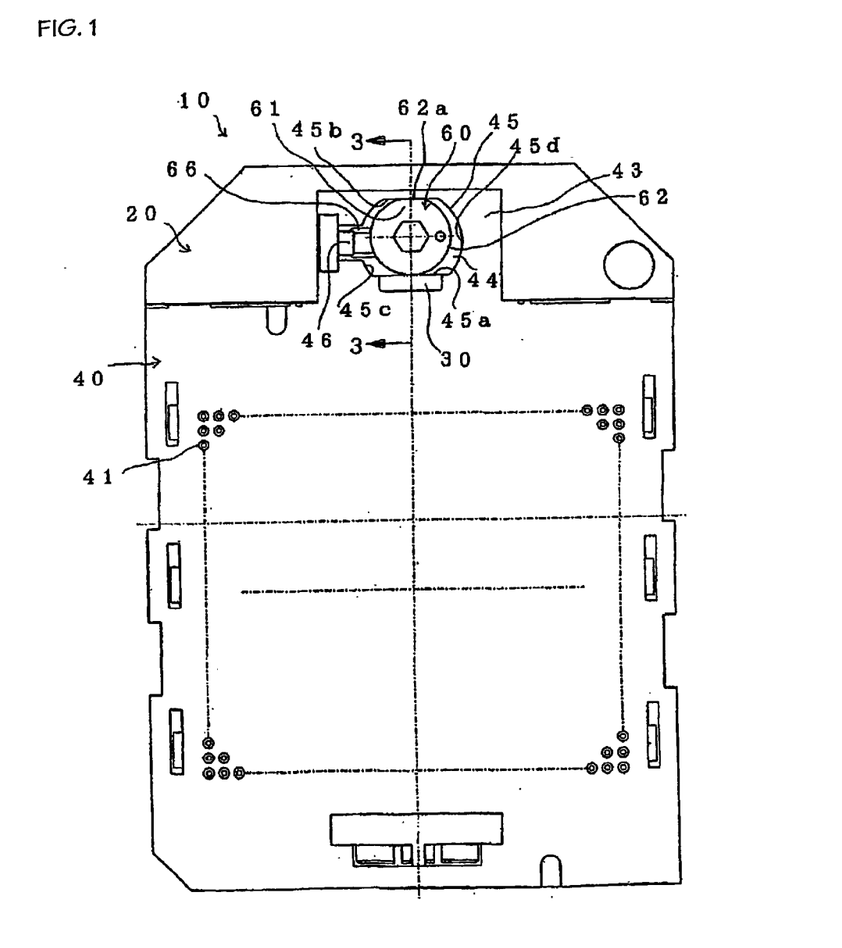
FIG. 1 is a plan view of the preferred embodiment of a socket for a PGA package according to the present invention.
Figure 2:
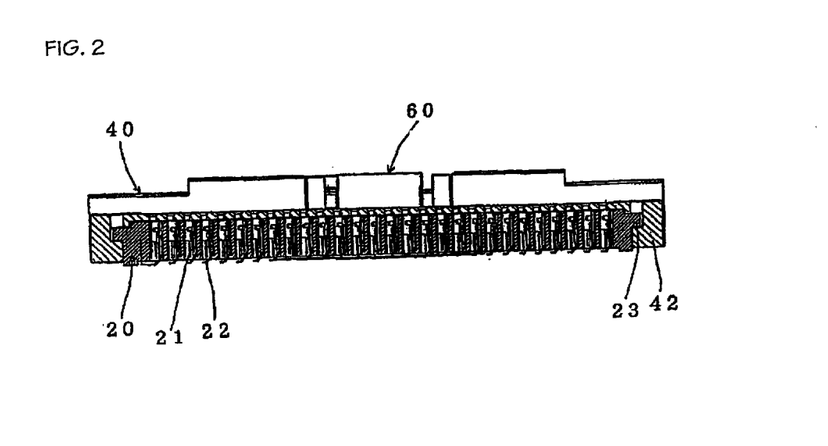
FIG. 2 is a longitudinal section of the preferred embodiment of the socket for the PGA package.

FIGS. 1 and 2 show the preferred embodiment of a socket 10 for a PGA package. The socket 10 for the PGA package is constructed with a substantially quadrangular base housing 20 and a substantially quadrangular slide plate 40 provided on an upper side of the base housing 20. In the base housing 20, a plurality of terminals 21 shown in FIG. 2 are loaded in grid array form. Tails 22 extending from the terminals 21 are arrayed on the bottom surface of the base housing 20. Engaging portion of the terminal 21 is opened at the upper surface for receiving a lead pin of the PGA package (not shown).

The slide plate 40 is formed with through holes 41 in a grid array form corresponding to the terminals 21 on the side of the base housing 20. Sectionally L-shaped side plates 42 depending from both side edges of the slide plate 40 engage with guide ridge 23 formed on the side surface of the base housing 20 in a holding manner. Thus, the slide plate 40 is slidable only in a direction along the side edge (up and down direction in FIG. 1).

Figure 3:
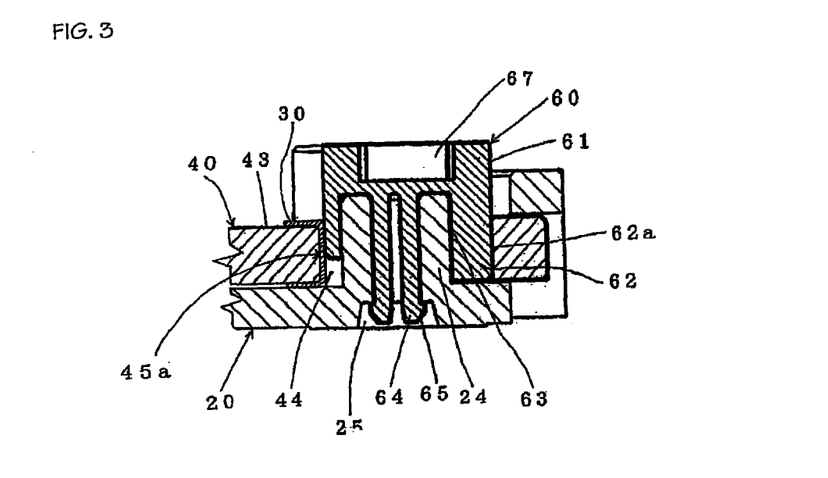
FIG. 3 is an enlarged section of a com member engaging portion of the socket for the PGA package taken along line 3—3 of FIG. 1.
Figure 4:
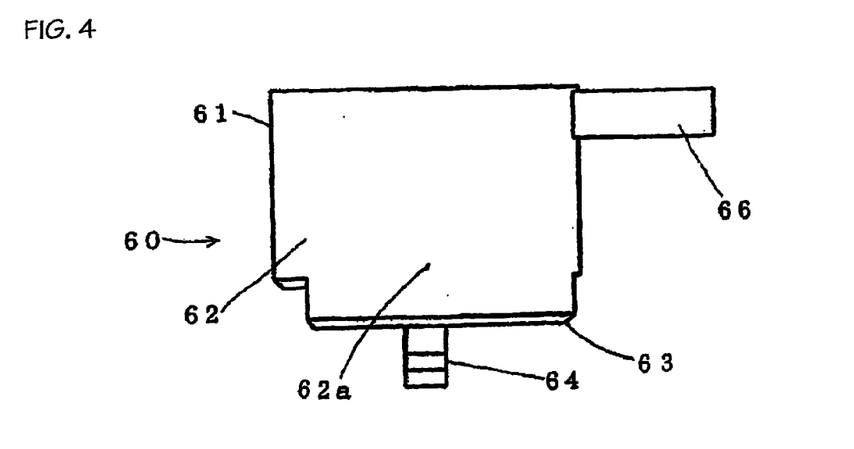
FIG. 4 is a front elevation of the cam member.
Figure 5:
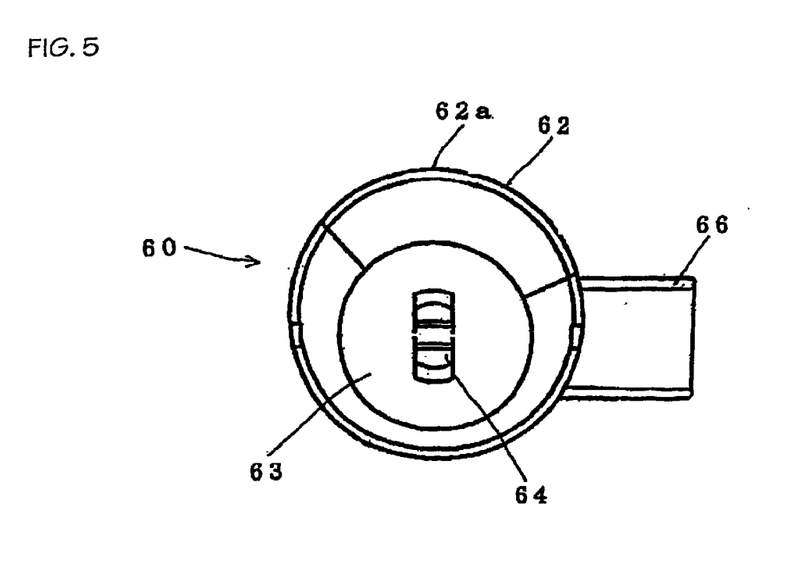
FIG. 5 is a bottom view of the cam member.
Figure 6:
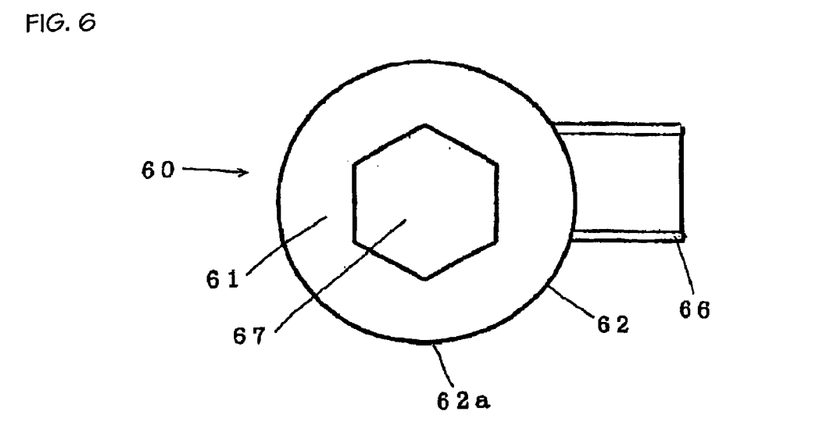
FIG. 6 is a plan view of the cam member.
Figure 7:
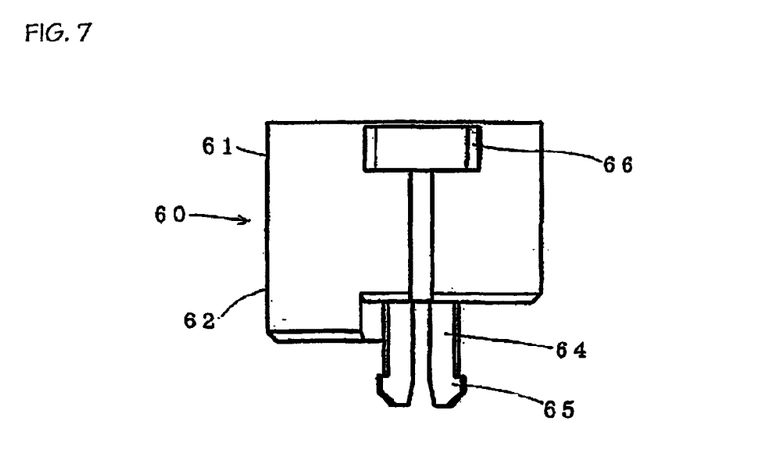
FIG. 7 is a side elevation of the cam member.
Figure 8:
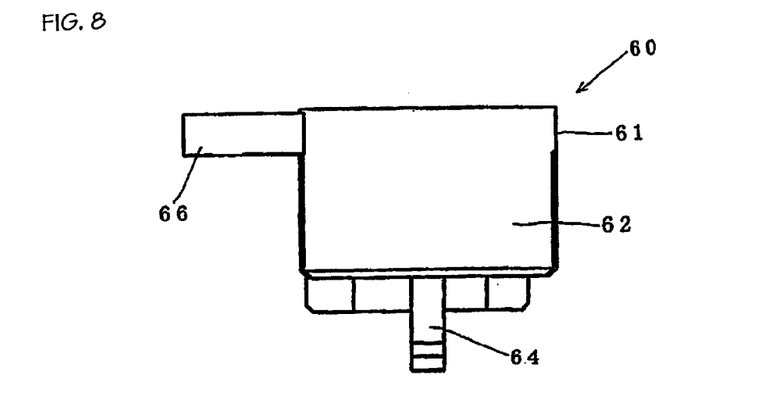
FIG. 8 is a back elevation of the cam member.
Figure 9:
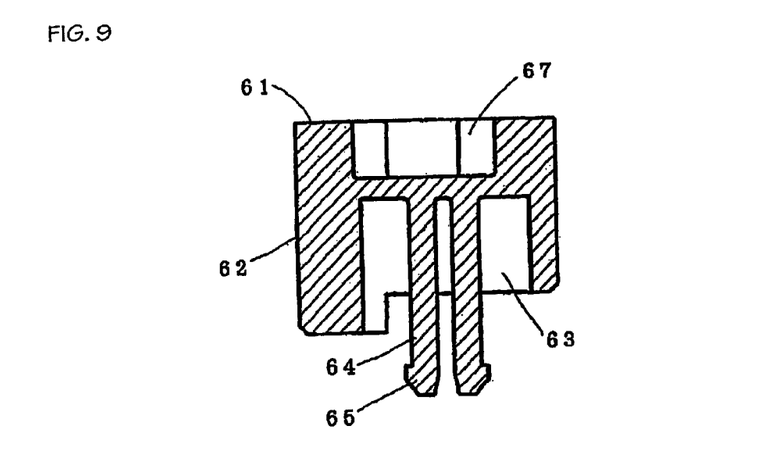
FIG. 9 is a section of the cam member.

As shown in FIG. 3 (which is a section taken along line 3—3 of FIG. 1), the slide mechanism of the slide plate 40 is constructed with a cam member 60 provided rotatable at one end of the base housing 20 (which cam member is rotatable about an axis extending perpendicular to the sheet surface of FIG. 1), and an opening portion 44 formed in an end portion 43 extending from one end of the slide plate 40. A cam portion 61 of the cam member 60 extends upwardly through the opening portion 44. A cam surface 62 opposes the opening edge 45.

The cam member 60 is a cylindrical one piece member having a construction shown in FIGS. 4 to 9. An external upper portion forms a cam portion 61. A bearing hole 63 is formed eccentrically relative to the cam portion 61 inside from the bottom surface side. By fitting the bearing hole 63 on a pivot axle 24 provided on the base housing 20, the cam member 60 is rotatable about the pivot axle 24. The pivot axle 24 extends beyond the upper surface of the slide plate 40 through the opening portion 44 of the slide plate 40. The bearing hole 63 is fitted over the entire length of the pivot axle 24.

A pair of engaging legs 64 are extended downwardly along a center axis of the bearing hole 63. The engaging legs 64 extend beyond the bottom surface of the cam member 60. Outwardly extending hooks 65 are formed at the distal ends of the engaging legs 64. A pair of engaging legs 64 are inserted into the pivot axle 24 for placing the hook portions 65 within a recess 25 formed in the bottom of the base housing 20. The hooks 65 engage the cam member 60 to the base housing 20.

As shown in FIGS. 4 to 9, the cam member 60 is formed with a contact surface 62a on the cam surface 62 formed in the cam portion 61. The contact surface 62a is formed at a portion most distant from the center of the bearing hole 63, namely at the position where a lifting amount of the cam surface 62 becomes maximum. The contact surface 62a is formed over the entire length in the longitudinal direction of the cam portion 61. Two indicators 66 are radially projected from the upper portion of the cam portion 61, in a direction perpendicular to the contact surface 62a as viewed from the center of the bearing hole 63.

On the upper surface of the cam portion 61, namely the upper surface of the cam member 60, a hexagonal recess 67 is formed so that the cam member 60 may be directly driven to rotate by means of a rotating tool formed with a hexagonal rod. The hexagonal recess 67 provided on the upper surface of the cam member 60 is provided at the center of the upper surface thereof As can be seen from FIG. 3, the center is offset from the center of the pivot axle 24. By this, when the cam member 60 is rotated about the pivot axle 24, the contact surface 62a of the cam surface 62 biases the slide plate 40 toward the left as viewed in FIG. 3.

The opening portion 44 formed in the end piece 43 of the slide plate 40 is formed into a rounded quadrangular shape and is constructed with straight edges 45a and 45b mutually opposing in back and forth direction and arc-shaped edges 45c and 45d opposing in left and right direction. The distance between the straight edges 45a and 45b is substantially equal to the diameter of the cam portion 61 of the cam member 60. The arc-shaped edges 45c and 45d are opposed in a left and right direction with a distance greater than the distance between the straight edges 45a and 45b.

A stopper 46 is provided on the outside of one of the sides of the opening portion 44, to engage with the two indicators 66 in a manner that the two indicators 66 holds the socket in an open position (the position where the PGA package is not loaded on the socket, as illustrated in FIG. 1).

Figure 11:
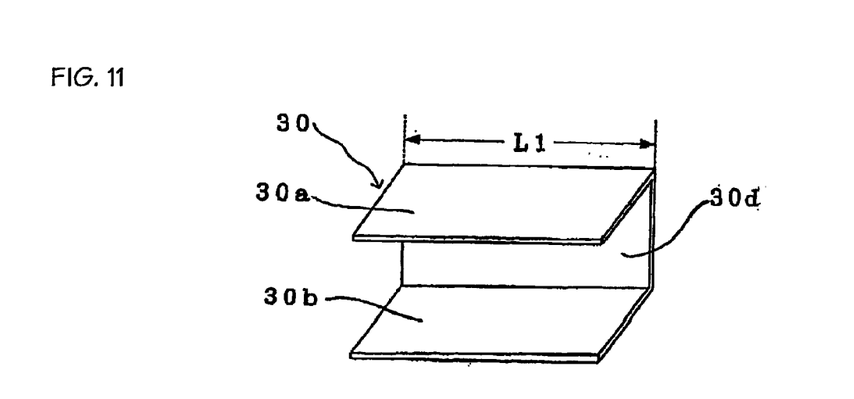
FIG. 11 is a perspective view of a reinforcement plate.

In the embodiment shown in FIG. 3, a reinforcement plate 30 formed of a metal plate is mounted on the straight edge 45a of the slide plate 40. As shown in FIG. 11, the reinforcement plate 30 is formed by bending the metal plate into sectionally channel-shaped configuration and is mounted on the opening edge 45 of the slide plate 40 in snap-in manner. The reinforcement plate 30 is slidable along the straight edge 45a. The length L1 of the reinforcement plate 30 in a direction along the straight edge 45a is shorter than the length of the straight edge 45a and is set so that the contact surface 62a of the cam member 60 does not contact directly to the slide plate 40 even at the position where the straight edge 45a is not in contact with reinforcement plate 30.

FIGS. 1 and 3 shows the slide plate 40 in an open position, i.e., the pins of the PGA package are enabled for insertion up to the engaging portions of the terminals 21 of the base housing 20 with an insertion force of zero or close to zero. The two indicators 66 of the cam member 60 engage with the stopper 46 and the contact surface 62a formed on the cam surface 62 is engaged with the straight edge 45b of the opening portion 44.

Engagement between the contact surface 62a of the cam surface 62 and the straight edge 45b of the opening edge 45 may provide a tactile feel to an operator at the same time of engagement between the indicator 66 and the stopper 46 when the cam member 60 is rotated up to the condition shown in FIG. 1 in counterclockwise direction. Also, engagement between the contact surface 62a of the cam surface 62 and the straight edge 45b of the opening edge 45 also serves for preventing unintentional clockwise rotation of the cam member 60 by vibration or other causes. Since the indicator 66 and the stopper 46 are engaged, rotation of the cam member 60 in counterclockwise direction can also be prevented. In this condition, the PGA package to be connected is mounted on the slide plate 40 with the lead pins oriented downwardly. The lead pins can be inserted up to the engaging portion of the terminals 21 of the base housing 20 via through holes 41 of the slide plate with an insertion force of zero or close to zero.

Figure 10:
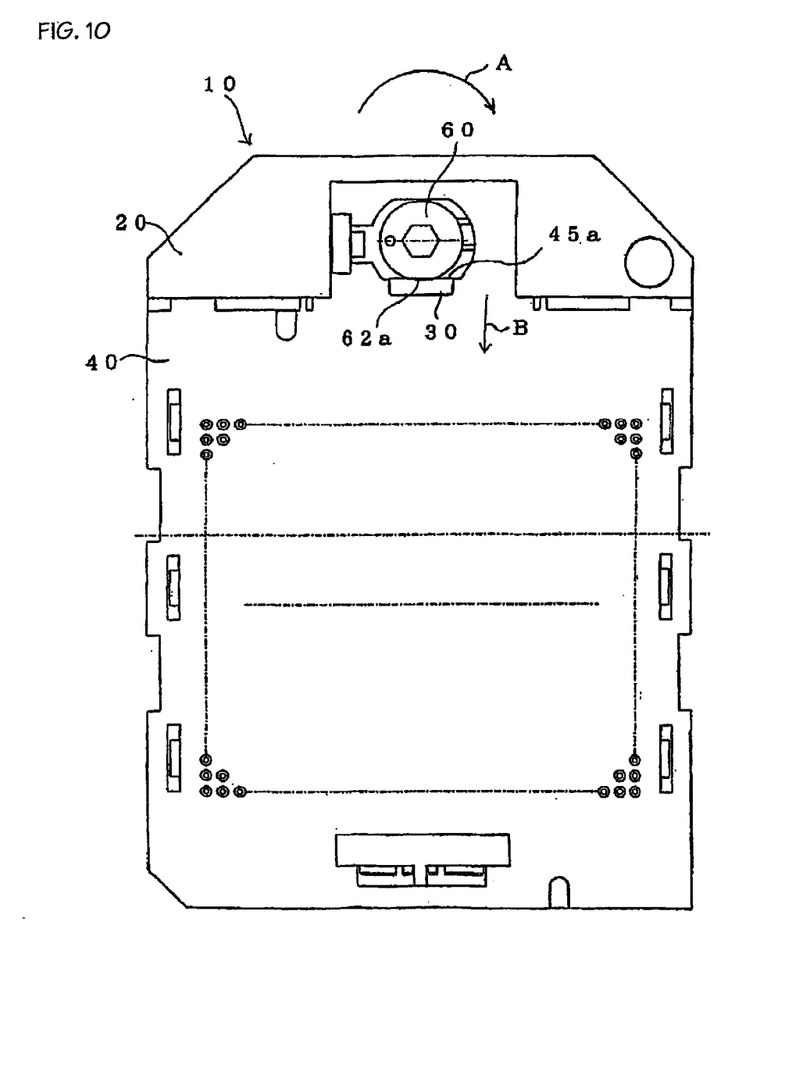
FIG. 10 is a plan view of the socket showing a condition where the slide plate is slid by rotating the cam member over 180 degrees from the condition shown in FIG. 1.

By rotating the cam member 60 after mounting the PGA package in the PGA socket in a clockwise direction of approximately 180 degrees, connection between the PGA package and the PGA socket is completed, as shown in FIG. 10. By rotation of the cam member 60 (direction of arrow A in FIG. 10), the slide plate 40 is slid downwardly (direction of arrow B in FIG. 10) along the base housing 20 to move the lead pins inserted into the through holes 41 to engage with respective terminals 21.

By this, the contact surface 62a of the cam surface 62 engages with straight edge 45a via the reinforcement plate 30. When the lead pins are moved to the position engaging with the terminals 21, resilient force of the lead pins acts on the slide plate 40 as a reaction force. The reaction force becomes greater in the PGA package as the number of terminals increase. When the reaction force directly acts on the slide plate 40 from the cam member 60, the slide plate 40 formed of insulative resin material, such as plastic or the like, can cause concaving deformation. However, in the embodiment of the present application, the reaction force is directed to the reinforcement plate 30. Therefore, the straight edge 45a of the slide plate 40 will never be deformed.

Furthermore, when the contact surface 62a of the cam surface 62 and the straight edge 45a of the opening edge 45 engage via the reinforcement plate 30, the engaging condition is maintained by the reaction force. Therefore, unintentional rotation of the cam member in the counterclockwise direction can be prevented. Accordingly, engagement between the lead pins and the terminals 21 will be maintained. Furthermore, with the reaction force being directed to the reinforcement plate 30, the slide plate 40 will never be deformed even when the cam member 60 is rotated many times. Therefore, reliability of terminal connection can be maintained for a long period to extend the life of the socket.

In the rotating operation of the cam member 60, because of a structure to engage the bearing hole 63 of the cam member 60 with the pivot axle 24 of the base housing 20 in relatively long range close to the entire length of the cam member 60, the cam member 60 will never tilt, thereby allowing for smooth rotational operation. Additionally, sliding of the slide plate 40 can be assured in the predetermined distance. The engaging feature of the cam member 60 prevents the cam member 60 from separating from the base housing as a result of the sliding resistance of the slide plate 40.

Figure 12:
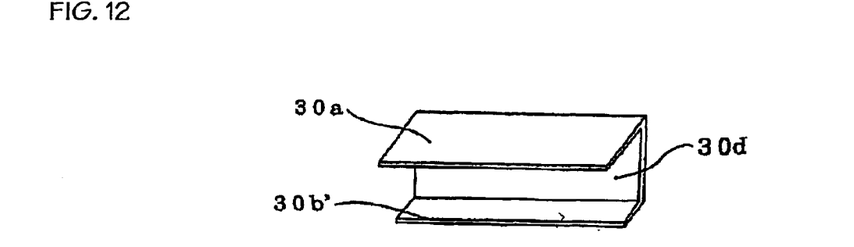
FIG. 12 is a perspective of another embodiment of the reinforcement plate.

In the shown embodiment set forth above, as shown in FIG. 11, the reinforcement plate 30 is constructed with equal length (lengths of the walls 30a and 30b extending in a direction away from base wall 30d) of upper wall 30a and the lower wall 30b to have a channel shaped cross-section. However, the present invention should not be limited to the particular construction of the shown embodiment. For instance, the length of the lower wall 30b can be shorter as shown in FIG. 12. With the construction shown in FIG. 12, mounting of the reinforcement plate 30 on the slide plate 40 by snap-in can be facilitated to contribute for lowing of assembling cost.

As set forth above, the reinforcement plate 30 is slidably mounted on the slide plate 40. When the PGA package is firmly loaded on the socket by rotating the cam member 60, a large force is created between the cam member 60 and the reinforcement plate 30. At this time, if the reinforcement plate 30 is immovably fixed on the slide plate 40, it becomes difficult to rotate the cam member 60 to the final position. However, in the shown embodiment, since the reinforcement plate 30 is movable along the straight edge 45a, the cam member 60 can easily rotate to the final position to contact the contact surface 62a to the straight edge 45a to achieve good loading ability of the PGA package to the socket.

Figure 13:
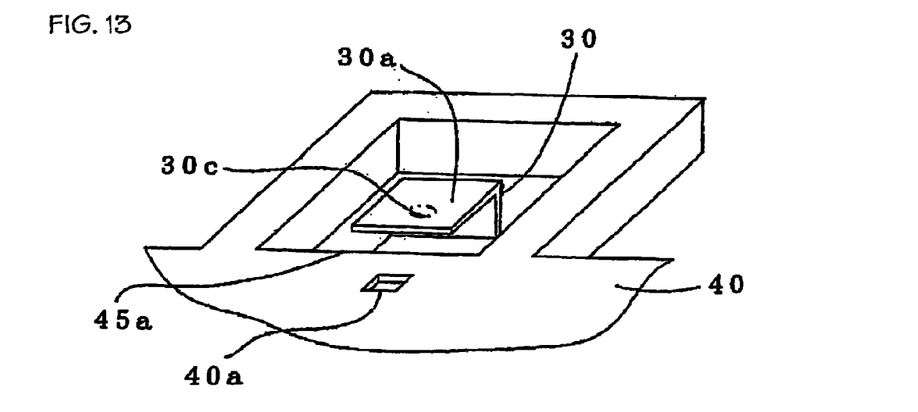
FIG. 13 is an illustration of a mounting structure of a further embodiment of the reinforcement plate.

For improvement of loading ability of the PGA package on the socket 10 and for facilitating assembling of the reinforcement plate 30 upon assembling the socket, a projection 30c is provided on the lower surface of the upper wall 30a of the reinforcement plate 30. Additionally, a recessed portion 40a, having wider area than the projection 30c, is formed on the slide plate 40 at the position engaging the projection 30c, as shown in FIG. 13. When the reinforcement plate 30 is mounted on the slide plate 40 by snap-in or other means, the projection 30c enters the recessed portion 40a and the reinforcement plate 30 will be retained by the slide plate 40 during insertion of the PGA package into the socket 10. Furthermore, the recessed portion 40a is sized to assure movement of the reinforcement plate 30 so that loading of the PGA package to the socket 10 can occur.

Although particular embodiments of the invention have been described in detail for purposes of illustration, various modifications and enhancements may be made without departing from the spirit and scope of the invention. Therefore, the present invention should not be understood as limited to the specific embodiment set out above but to include all possible embodiments which can be embodied within a scope encompassed and equivalents thereof Accordingly, the invention is not to be limited except as by the appended claims.

What is claimed is:

1. A PGA socket, comprising a base housing, a slide plate, the slide plate having an upper surface and a lower surface, the slide plate being placed on an upper surface of the base housing and being slidable between an open position and a locked position, and a cam member rotatably supported on the base housing, the cam member including a cam surface extending through an opening formed in the slide plate, the opening including an edge, characterized in that:

the PGA socket includes a reinforcement plate mounted on a straight edge of the opening edge engaging with a contact surface formed on the cam surface, the opening edge extending from the lower surface to the upper surface of the slide plate and the reinforcement plate being located on the straight edge between the lower surface and the upper surface of the slide plate.

2. The PGA socket of claim 1, wherein the reinforcement plate engages the contact surface of the cam member when the slide plate is in the locked position.

3. The PGA socket of claim 1, wherein the slide plate is formed of an insulative synthetic resin, the reinforcement plate mounted on the straight edge is formed with a metal plate, and the cam member is formed of a metal.

4. The PGA socket of claim 1, wherein the slide plate includes a base wall and two side walls extending outwardly from the base wall.

5. The PGA socket of claim 4, wherein one of the side walls includes a projection that is received in a recess on the base housing.

6. The PGA socket of claim 1, wherein the length of the reinforcement plate is less than the length of the opening edge.

7. The PGA socket of claim 5, wherein one of the side walls is shorter than the other side wall in a direction extending outwardly from the base wall.

8. The PGA socket of claim 1, wherein the length of the reinforcement plate is set at a length to permit engagement with the contact surface of the cam member.

9. The PGA socket of claim 1, wherein the base housing include a stopper and the cam member includes at least one indicator that makes contact with the stopper.

10. The PGA socket of claim 1, wherein the cam member is mounted on a pivot axle.

11. The PGA socket of claim 5, wherein the recess in the housing is larger than the protrusion, therefore allowing limited movement of the reinforcement plate.

12. The PGA socket of claim 1, wherein the base housing includes a plurality of terminals in grid array form and the slide plate is formed with through holes in a grid array form corresponding to respective terminals of the base housing.

13. The PGA socket of claim 12, wherein the slide plate is formed of an insulative synthetic resin, the reinforcement plate mounted on the straight edge is formed with a metal plate, and the cam member is formed of a metal.

14. The PGA socket of claim 12, wherein the reinforcement plate is formed in cross-sectionally channel shaped configuration and is mounted on the straight edge of the slide plate.

15. The PGA socket of claim 12, wherein the reinforcement plate is formed into cross-sectionally channel-shaped configuration having a base wall, an upper wall and a lower wall, the lower wall has a length shorter than the upper plate in a direction extending outwardly from the base wall.

16. The PGA socket of claim 12, wherein a length of the reinforcement plate is set at a length to permit engagement with the contact surface of the cam member.

17. The PGA socket of claim 12, wherein the base housing include a stopper and the cam member includes at least one indicator that makes contact with the stopper.

18. The PGA socket of claim 12, wherein the cam member is mounted on a pivot axle.

19. The PGA socket of claim 15, wherein one of the upper and lower walls includes a projection that is received in a recess on the base housing.

20. The PGA socket of claim 19, wherein the recess in the housing is larger than the protrusion, therefore allowing limited movement of the reinforcement plate.

* * * * *